(12) United States Patent
Akiyama et al.

(10) Patent No.: US 8,049,270 B2
(45) Date of Patent: Nov. 1, 2011

(54) SEMICONDUCTOR DEVICE

(75) Inventors: Miwako Akiyama, Hachioji (JP); Akio Nakagawa, Chigasaki (JP); Yusuke Kawaguchi, Miura-gun (JP); Syotaro Ono, Yokohama (JP); Yoshihiro Yamaguchi, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 268 days.

(21) Appl. No.: 11/924,175

(22) Filed: Oct. 25, 2007

(65) Prior Publication Data

US 2008/0099837 A1 May 1, 2008

(30) Foreign Application Priority Data

Oct. 26, 2006 (JP) .................. 2006-291291

(51) Int. Cl.
*H01L 29/732* (2006.01)
(52) U.S. Cl. . 257/328; 257/329; 257/330; 257/E21.537; 257/E21.383; 438/212; 438/268
(58) Field of Classification Search .................. 257/216, 257/219, 328, 329, 330, 331, 341, E21.537, 257/E21.538, E29.201, 302, 332, E21.383; 438/212, 268
See application file for complete search history.

(56) References Cited

U.S. PATENT DOCUMENTS

| | | | |
|---|---|---|---|
| 5,633,180 A * | 5/1997 | Bajor .......................... 438/358 |
| 6,844,592 B2 | 1/2005 | Yamaguchi et al. |
| 7,115,475 B2 | 10/2006 | Yamaguchi et al. |
| 7,161,208 B2 | 1/2007 | Spring et al. |
| 7,294,885 B2 * | 11/2007 | Tihanyi et al. ................ 257/341 |
| 7,332,770 B2 * | 2/2008 | Kobayashi ..................... 257/328 |
| 2003/0151087 A1 * | 8/2003 | Weber et al. ................... 257/327 |
| 2004/0245570 A1 * | 12/2004 | Ninomiya ...................... 257/330 |
| 2005/0006717 A1 * | 1/2005 | Yamaguchi et al. .......... 257/500 |
| 2006/0018634 A1 | 1/2006 | Arad |
| 2007/0114599 A1 * | 5/2007 | Hshieh ........................... 257/330 |

FOREIGN PATENT DOCUMENTS

| | | |
|---|---|---|
| JP | 2001-313393 | 11/2001 |
| JP | 2003-273355 | 9/2003 |
| JP | 2006-93457 | 4/2006 |

* cited by examiner

*Primary Examiner* — Cuong Q Nguyen
*Assistant Examiner* — Yosef Gebreyesus
(74) *Attorney, Agent, or Firm* — Oblon, Spivak, McClelland, Maier & Neustadt, L.L.P.

(57) ABSTRACT

This semiconductor device an epitaxial layer of a first conductivity type formed on a surface of the first semiconductor layer, and a base layer of a second conductivity type formed on a surface of the epitaxial layer. A diffusion layer of a first conductivity type is selectively formed in the base layer, and a trench penetrates the base layer to reach the epitaxial layer. A gate electrode is formed in the trench through the gate insulator film formed on the inner wall of the trench. A first buried diffusion layer of a second conductivity type is formed in the epitaxial layer deeper than the bottom of the gate electrode. A second buried diffusion layer connects the first buried diffusion layer and the base layer and has a resistance higher than that of the first buried diffusion layer.

15 Claims, 7 Drawing Sheets

SEMICONDUCTOR DEVICE

CROSS REFERENCE TO RELATED APPLICATIONS

This application is based on and claims the benefit of priority from prior Japanese Patent Application No. 2006-291291, filed on Oct. 26, 2006, the entire contents of which are incorporated herein by reference.

BACKGROUND OF THE INVENTION

1. Field of the Invention

The present invention relates to a semiconductor device, more particularly, to a semiconductor device with a drift layer having a so-called floating structure.

2. Description of the Related Art

In recent years, demands for a power MOSFET has greatly increased not only in a market for large-current/high-breakdown voltage switching power supplies (for example, a breakdown voltage of 600V) but also in a market for energy-saving switching devices for mobile communication devices (for example, a breakdown voltage of 30V) such as note-type personal-computers.

The power MOS transistor in such an energy-saving switching market is required to reduce the capacitance between a gate and a drain. Reducing the gate-drain capacitance allows a low voltage operation, which makes it possible to be directly driven by a battery voltage. It also allows a low ON-state resistance, and a switching loss reduction.

On the other hand, although the ON-state resistance of a MOS transistor mainly consists of a channel resistance and a drift resistance. A so-called super-junction structure and a so-called floating structure are known as a structure of a MOS transistor for reducing a drift resistance.

The super-junction structure forms a drift layer by embedding a longitudinal strip-like p type pillar layers and n type pillar layers in turn in a transverse direction (for example, See JP 2003-273355A). A super-junction structure may spread a depletion layer in a transverse direction along the direction the p/n pillar layers are arranged when a MOS transistor is non-conductive. This makes the breakdown voltage of the element higher. In addition, a pseudo non-doped layer may be generated when the charge quantities (impurity quantities) included in the p type pillar layers and the n type pillar layers are made equal. This is effective to retain a high breakdown voltage and cause a current flowing through highly doped, n-type pillar layers, thereby realizing a low on-resistance that exceeds the material limit.

A floating structure is formed by burying a p type buried layer as a floating layer in an n type epitaxial layer as a drift layer by ion implantation, for example. The p type buried layer is not electrically connected to a p type base layer where a MOS transistor is formed. Also in this floating structure, the depletion layer formed between the p type buried layer and the n type epitaxial layer when a MOS transistor is non-conductive enables the breakdown voltage to be maintained at a high value. This floating structure is effective for improvement in properties of MOS transistors with a breakdown voltage of about 60V to 100V. Especially, when compared to a MOS transistor with the super-junction structure where a p type pillar is formed in the same depth, it has been confirmed that the MOS transistor with a floating structure has an improved trade-off between an ON-state resistance and a breakdown voltage.

However, the MOS transistor with such a floating structure has a long turn-on time as a problem. Specifically, once the p type buried layer in the MOS transistor is depleted at the OFF state, the transistor does not moves to a normal ON state until the depletion layer in the p type buried layer disappears.

Moreover, the depletion layer extends to the peripheral area of the p type buried layer just after the turn-on. This causes the carrier-conduction area to be narrowed, the resistance of the element to become high, and the switching loss to become larger.

SUMMARY OF THE INVENTION

The semiconductor device according to the present invention comprises: a first semiconductor layer of a first conductivity type; an epitaxial layer of a first conductivity type formed on a surface of the first semiconductor layer; a base layer of a second conductivity type formed on a surface of the epitaxial layer; a diffusion layer of a first conductivity type selectively formed in the base layer; a trench penetrating the base layer to reach the epitaxial layer; a gate electrode formed in the trench through a gate insulator film formed on an inner wall of the trench; a first main electrode connected to the rear surface of the first semiconductor layer; a second main electrode connected to the diffusion layer and the base layer; a first buried diffusion layer of a second conductivity type formed in the epitaxial layer deeper than the bottom of the gate electrode: and a second buried diffusion layer connecting the first buried diffusion layer and the base layer and having a resistance higher than that of the first buried diffusion layer.

DETAILED DESCRIPTION OF THE EMBODIMENTS

Next, a semiconductor device according to an embodiment of the present invention is explained in detail with reference to drawings. Although the first conductivity type is defined as an n-type and the second conductivity type is defined as a p-type in the explanation below, it is also possible that the first conductivity type is defined as a p-type and the second conductivity type is defined as an n-type.

In the explanation below, "n+ type" means that its impurity concentration is higher than "n type". Also, "n type" means that its impurity concentration is higher than "n− type." Similarly, "p+ type" means that its impurity concentration is higher than "p type", and "p type" means that its impurity concentration is higher than "p− type."

First Embodiment

Figure 1:
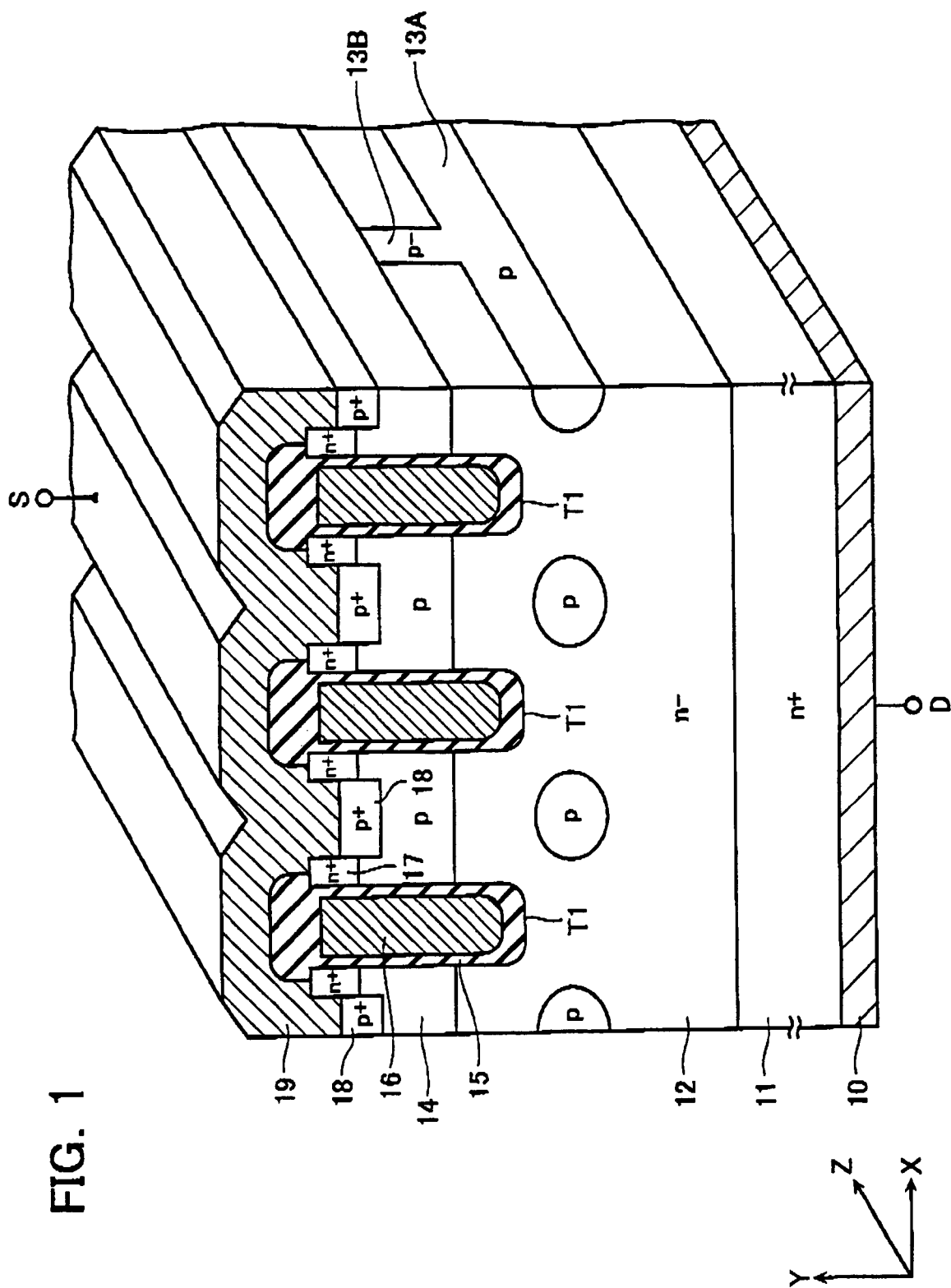
FIG. 1 is a sectional view showing a structure of a semiconductor device according to a first embodiment of the present invention.

FIG. 1 is a sectional view showing a structure of a semiconductor device according to the first embodiment of the present invention. As shown in FIG. 1, the semiconductor devices of this embodiment includes an n+ type semiconductor substrate 11 as a drain region, and n− type epitaxial layer (a drift layer) grown on this by an epitaxial growth. In addition, a trench-gate type MOS transistor is formed thereon. A drain electrode 10 is formed on the rear surface of the n+ type semiconductor substrate 11.

p type buried layers 13A are embedded and formed in the epitaxial layer 12 at equal intervals in the X direction. The p type buried layers 13A has a longitudinal direction along the Z direction. Furthermore, p− type connecting layers 13B are also formed in the epitaxial layer 12. This layer 13B connects the p type buried layer 13A and a p type base layer 14 which is described later. The p− type connecting layer 13B is connected to the p type buried layer 13A partly in a cross-section along a horizontal direction (parallel to the XZ plane).

Although p− type connecting layer 13B is formed only in one place in the Z direction, it is also possible to form plural p− type connecting layers 13B at several places in FIG. 1.

The p− type connecting layer 13B is smaller in impurity concentration than the p type buried layer 13A. For example, when the epitaxial layer 12 has an impurity concentration of 1.0e16 cm-3, and the p type buried layer 13A has an impurity concentration of 8.0e16 cm-3, the impurity concentration of the p− type connecting layer 13B may be set at 1.5e16 cm-3.

Such a relationship between the impurity concentration of the p type buried layer 13A and the p− type connecting layer 13B enables the semiconductor device according to this embodiment to enjoy an improved trade-off between the ON-state resistance and the breakdown voltage compared to the semiconductor device with a so-called super-junction structure. Moreover, properties equivalent to those of the semiconductor device with a floating structure can be acquired.

Furthermore, a p type base layer 14 is formed on the upper surface of the epitaxial layer 12 by ion implantation and thermal diffusion. In addition, plural trenches T1 are formed in this p type base layer 14 at equal intervals, by photolithography and reactive ion etching (RIE).

A gate electrode 16 formed of polysilicon or the like is buried in the trench T1 through the gate insulation film 15. Moreover, an n+ type source region 17 and a p+ type contact layer 18 are formed in the surface of the p type base layer 14 sandwiched by the gate electrodes 16. The n+ type source region 17 and the p+ type contact layer 18 are electrically connected to the source electrode 19.

In addition, as shown in FIG. 1, the gate electrode 16 is formed to have a stripe shape extending to a direction perpendicular to the paper in FIG. 1. Moreover, the source regions 17 and the p+ type contact layers 18 are formed on the surface of the p type base layer 14 in turn along a direction parallel with the longitudinal direction of this gate electrode 16. These contact layers 18 are electrically connected to the source electrode 19 with the source regions 17.

Figure 2:
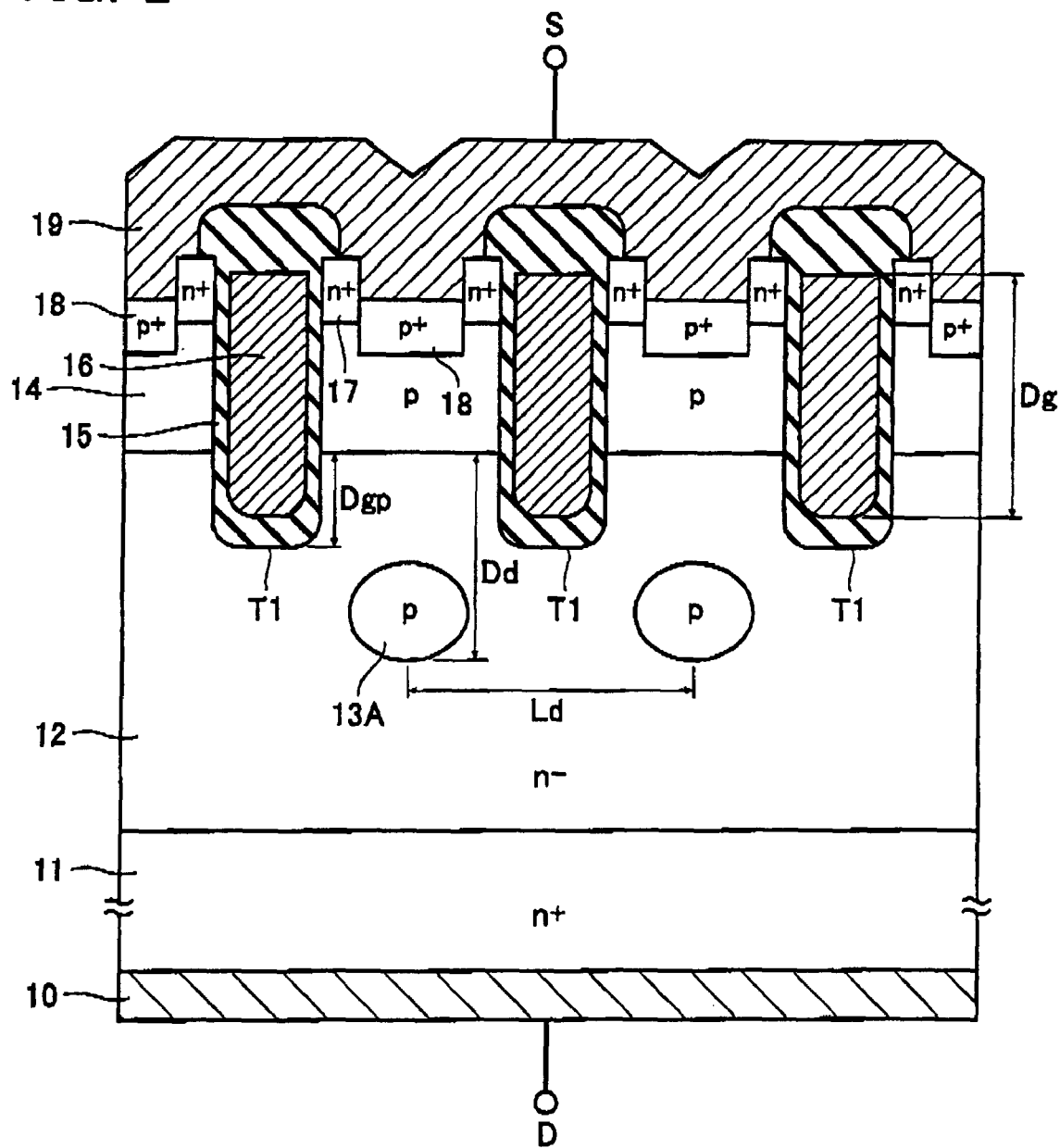
FIG. 2 is a sectional view showing a structure of a semiconductor device according to a first embodiment of the present invention.

Hereinafter, as shown in FIG. 2, a size of each part is defined as follows:

(1) Dd: a depth of the p type buried layer 13R from the p type base layer 14 (a depth of the p type buried layer);
(2) Dg: a depth of the gate electrode 16;
(3) Ld: an interval between p type buried layers 13A (a cell pitch); and
(4) Dgp: a distance between the bottom of the gate electrode 16 and the p type base layer 14 (a projection distance).

According to this embodiment, the p type buried layer 13A and the gate electrode 16 are formed so that the depth Dd of the p type buried layer 13A is larger than the projection distance Dgp.

Figure 3:
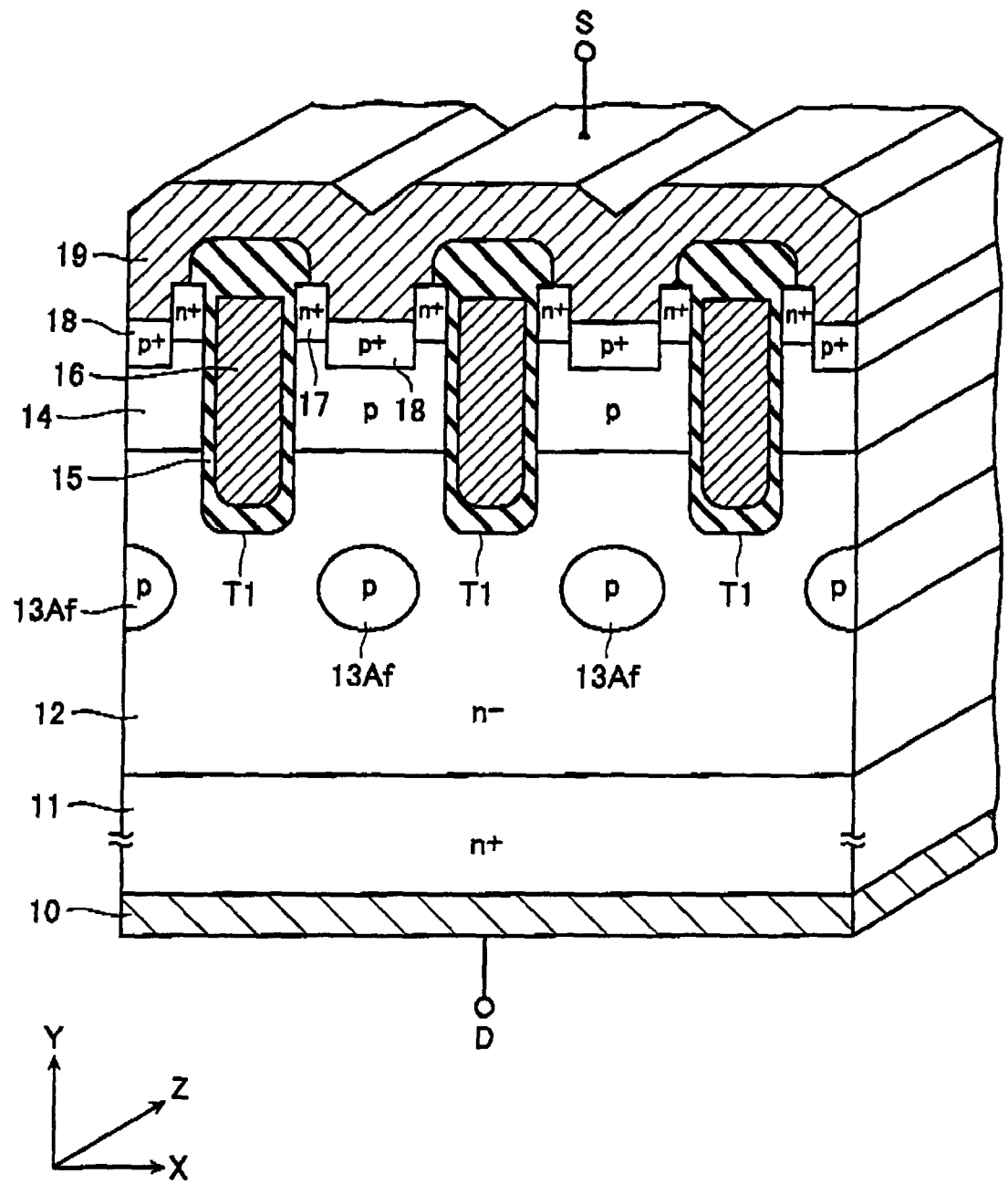
FIG. 3 shows a cross-sectional structure of a semiconductor device according to a comparative example.

The cross-sectional structure of the semiconductor device according to a comparative example is shown in FIG. 3. The same reference signs are given to the same elements as those in the first embodiment shown in FIG. 1.

This comparative example does not have any p− type connecting layers 13B, but a p type buried layer 13Af is formed to be a floating structure electrically independent from the p type base layer 14. In such a floating structure, a depletion layer starts to spread from the bottom of the p type base layer 14 when the MOS transistor is turned off. Thereafter, the peripheral of the p type buried layer 13Af starts depleted. Therefore, a depletion layer does not spread easily to the deep part of the epitaxial layer 12. This makes the capacitance Cgdf between a gate and a drain become high.

On the other hand, in the structure of this embodiment, the p type buried layer 13A is electrically connected to the p type base layer 14 by the p− type connecting layer 13B having a low impurity concentration. For this reason, a depletion layer starts to spread from the peripheral of the p type buried layer 13A first when the MOS transistor turns off. Therefore, compared to the comparative example, a depletion layer spreads easily to the deep part of the epitaxial layer 12, and the gate-drain capacitance Cgd can be made low compared to Cgdf in the case of FIG. 3.

However, in this embodiment, the p type buried layer 13A and the gate electrode 16 are formed so that the depth Dd of the p type buried-layer 13A is larger than the projection distance Dgp. The inventors has found, as a result of a computer simulation, that the degree of reduction in gate-drain capacitance Cgd becomes small, when the depth Dd of the p type buried-layer 13A is smaller than the projection distance Dgp. It is assumed that this occurs because the size of the depletion layer spreading around the p type buried-layer 13A becomes small influenced by the depletion layer spreading around the gate electrode 16.

A relationship between a depth Dd of the p type buried layer 13A and the gate-drain capacitance Cgd, which is obtained from a computer simulation, is explained with reference to a graph in FIG. 4. In this graph, the difference between the projection distance Dgp and the depth Dd of the p type buried layer 13A (Dgp−Dd) is expressed by the horizontal axis. Moreover, the vertical axis of this graph expresses the ratio of the gate-drain capacitance Cgd in the semiconductor device according to this embodiment to the gate-drain capacitance Cgdf of the semiconductor device with a floating structure having the same specification.

Figure 4:
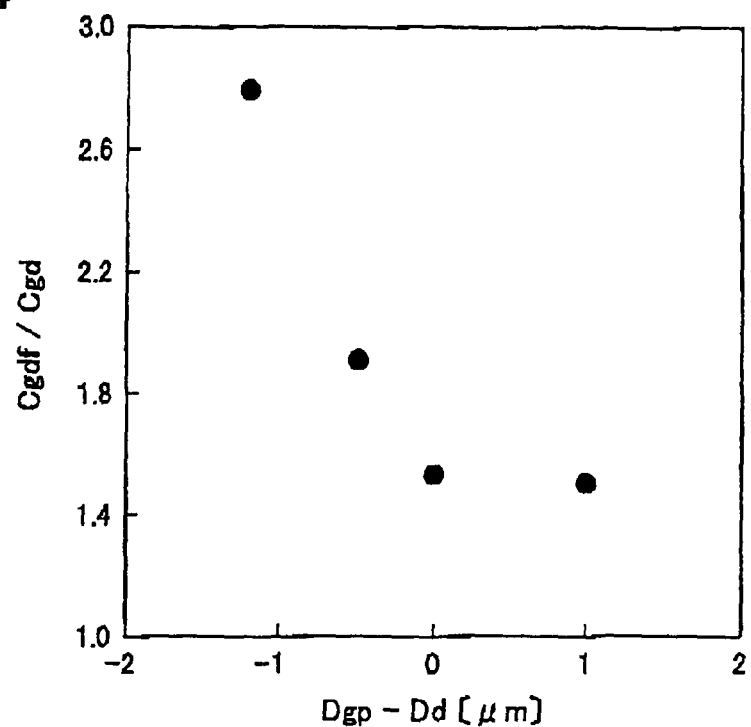
FIG. 4 shows a graph illustrating a relationship between a depth Dd of the p type buried layer and the gate-drain capacitance Cgd, which is obtained from a computer simulation.

As shown in FIG. 4, when a difference (Dgp−Dd) is a positive value, a capacitance ratio is about 1.5, and the remarkable difference about the gate-drain capacitance is not observed compared to a conventional floating structure. In contrast, when a difference (Dgp−Dd) is a negative value, a capacitance ratio becomes large, and the gate-drain capacitance may be improved (reduced) greatly compared to a floating structure. Moreover, it is possible to obtain an improved trade-off between an ON-state resistance and a breakdown voltage, which is an advantage of a floating structure. The level of the trade-off may be almost the same as that of a floating structure.

In addition, the inventors has found, as a result of a computer simulation, that it is also effective to optimize the value of the cell pitch Ld relative to Dg, Dd, and Ld, as well as making the difference (Dgp−Dd) negative.

Figure 5:
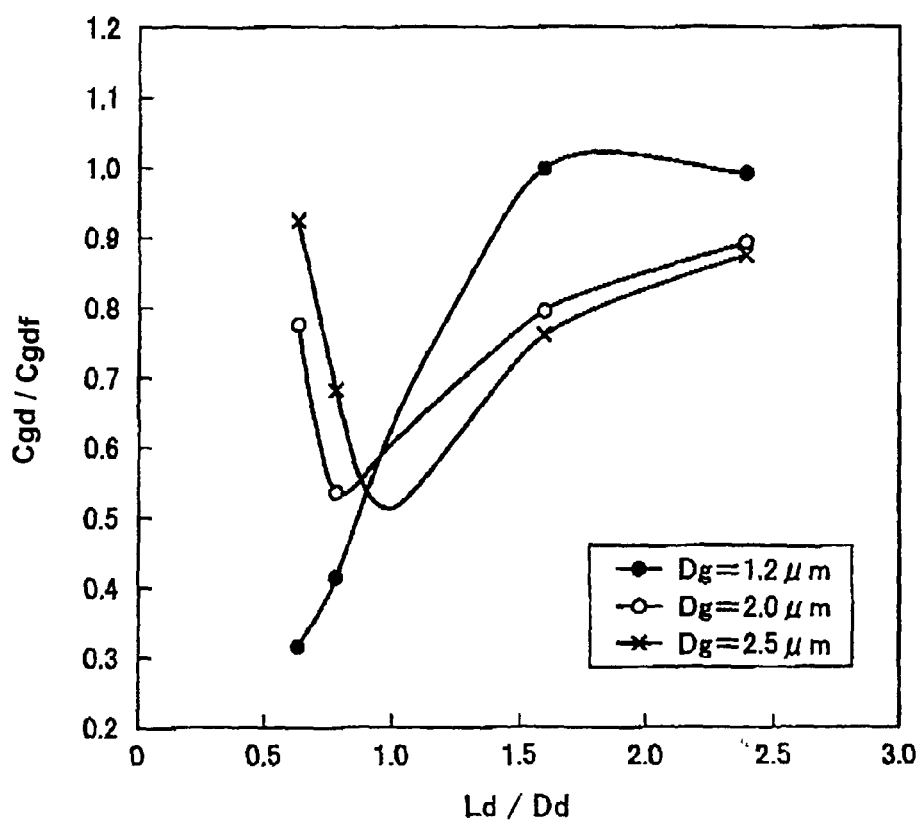
FIG. 5 shows a graph illustrating a relationship between a ratio (Ld/Dd) of the cell pitch Ld to a depth Dd of the p type buried layer (shown by the horizontal axis) and the capacitance ratio RC (=Cgd/Cgdf) (shown by the vertical axis).

FIG. 5 shows a graph illustrating a result of this computer simulation. The relationship between a ratio (Ld/Dd) of the cell pitch Ld to a depth Dd of the p type buried layer 13A is expressed by the horizontal axis. The capacitance ratio RC (=Cgd/Cgdf) is expressed by the vertical axis. Moreover, the depth Dg of the gate electrode 16 is changed among three values: 1.2 micrometers; 2.0 micrometers: and 2.5 micrometers. The simulation was performed for each of the three values. Note that in every case, simulation is done assuming that the depth Dd of the p type buried-layer 13A is 2.5 micrometers and the drain voltage is 8V.

(1) In the case of Dg=1.2 micrometers, when Ld/Dd was larger than 1.5, the capacitance ratio RC (=Cgd/Cgdf) did not change significantly. However, when Ld/Dd became 1.5 or less, the capacitance ratio RC reduced gradually. The ratio RC was about 0.3 when Ld/Dd was about 0.6. Therefore, in the range of Dg=in 1.2 micrometers, it is judged that Ld/Dd is preferably 1.5 or less, and it is preferable that Ld/(Dd−Dg) is 1.25 or less.

(2) In the case of Dg=2.0 micrometers, when Ld/Dd was larger than 0.8, the capacitance ratio RC (=Cgd/Cgdf) became 0.9 or less, which is sufficiently small value. However, when Ld/Dd became 0.8 or less, the capacitance ratio RC increased greatly. Therefore, in the range of Dg=2.0 micrometers, it is judged that Ld/Dd is preferably 0.8 or more, and it is preferable that Ld/(Dd−Dg) is 0.4 or more.

(3) In the case of Dg=2.5 micrometers, when Ld/Dd was larger than 1.0, the capacitance ratio RC (=Cgd/Cgdf) became 0.9 or less, which is sufficiently small value. However, when Ld/Dd became 1.0 or less, the capacitance ratio RC increased greatly. Therefore, in the range of Dg=in 2.5 micrometers, it is judged that Ld/Dd is preferably 1.0 or more, and it is preferable that Ld/(Dd−Dg) is 0.4 or more.

As mentioned above, judging from (1)-(3), it is preferable that Ld/(Dd−Dg) is:

$$0.4 < Ld/(Dd-Dg) < 1.25.$$

Second Embodiment

Figure 6:
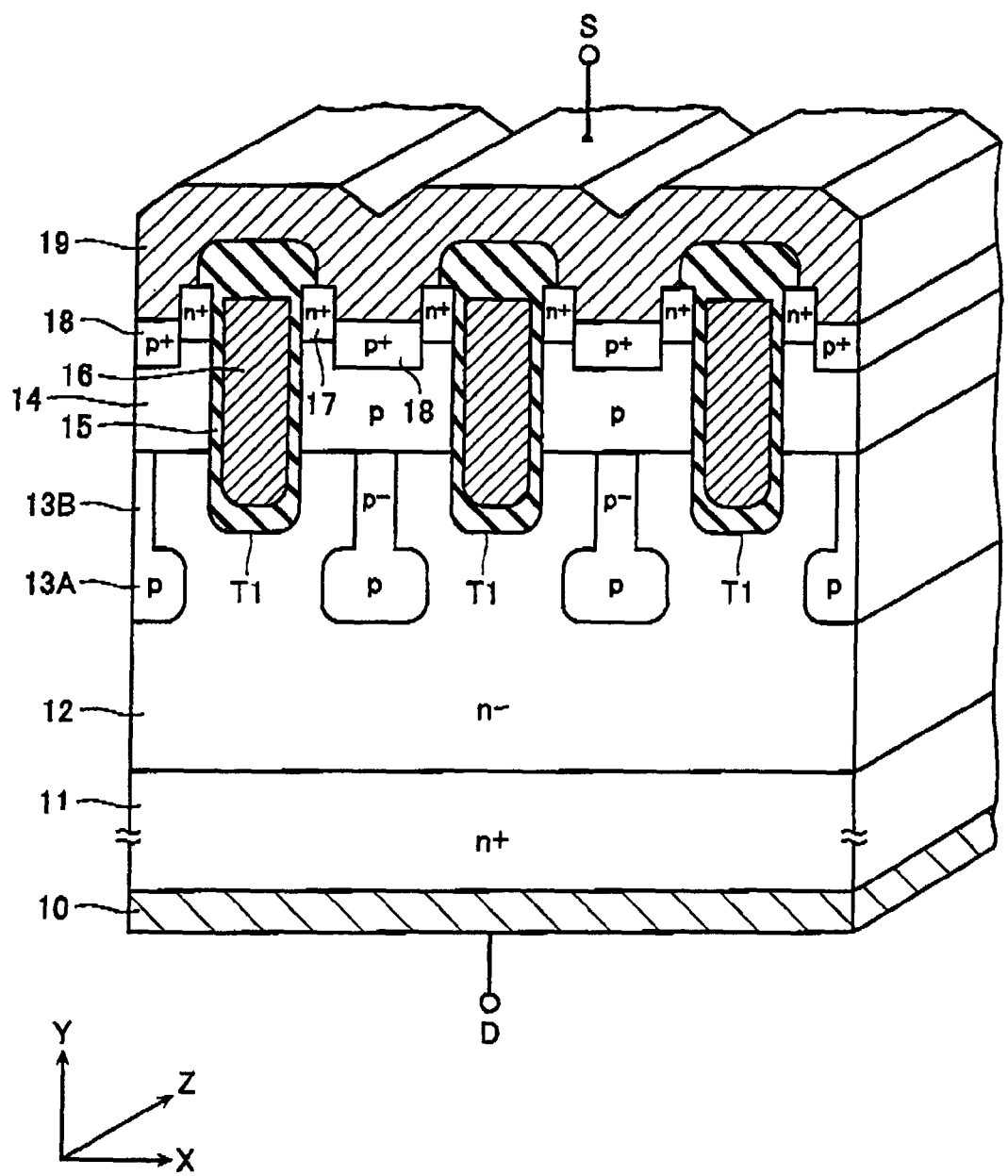
FIG. 6 is a sectional view showing a structure of a semiconductor device according to a second embodiment of the present invention.

Next, a semiconductor device according to a second embodiment of the present invention is explained with reference to FIG. 6. The same elements in FIG. 6 as those in the first embodiment are designated with the same reference numerals and their detailed description is omitted here. This embodiment is different from the first embodiment in that the p− type connecting layers 13B are connected to the p type buried layer 13A in the whole part (not one part) of the horizontal cross-section (the XZ plane). Namely, the cross-sectional view of the p− type connecting layer 13B along the XZ plane is a stripe shape, which is almost the same as that of the p type buried layer 13A. Other features are the same as that of the first embodiment.

In addition, the p type buried layer 13A and the p− type connecting layer 13B may be formed using the same mask, by changing an acceleration voltage and an impurity dose amount of ion implantation. For example, the p− type connecting layer 13B may be formed to have a straight profile as shows in FIG. 6, by continuously changing an acceleration voltage to plural values while keeping the impurity dose amount constant. The p type buried layer 13A may be formed by increasing an impurity dose amount while increasing an acceleration voltage further.

Third Embodiment

Figure 7:
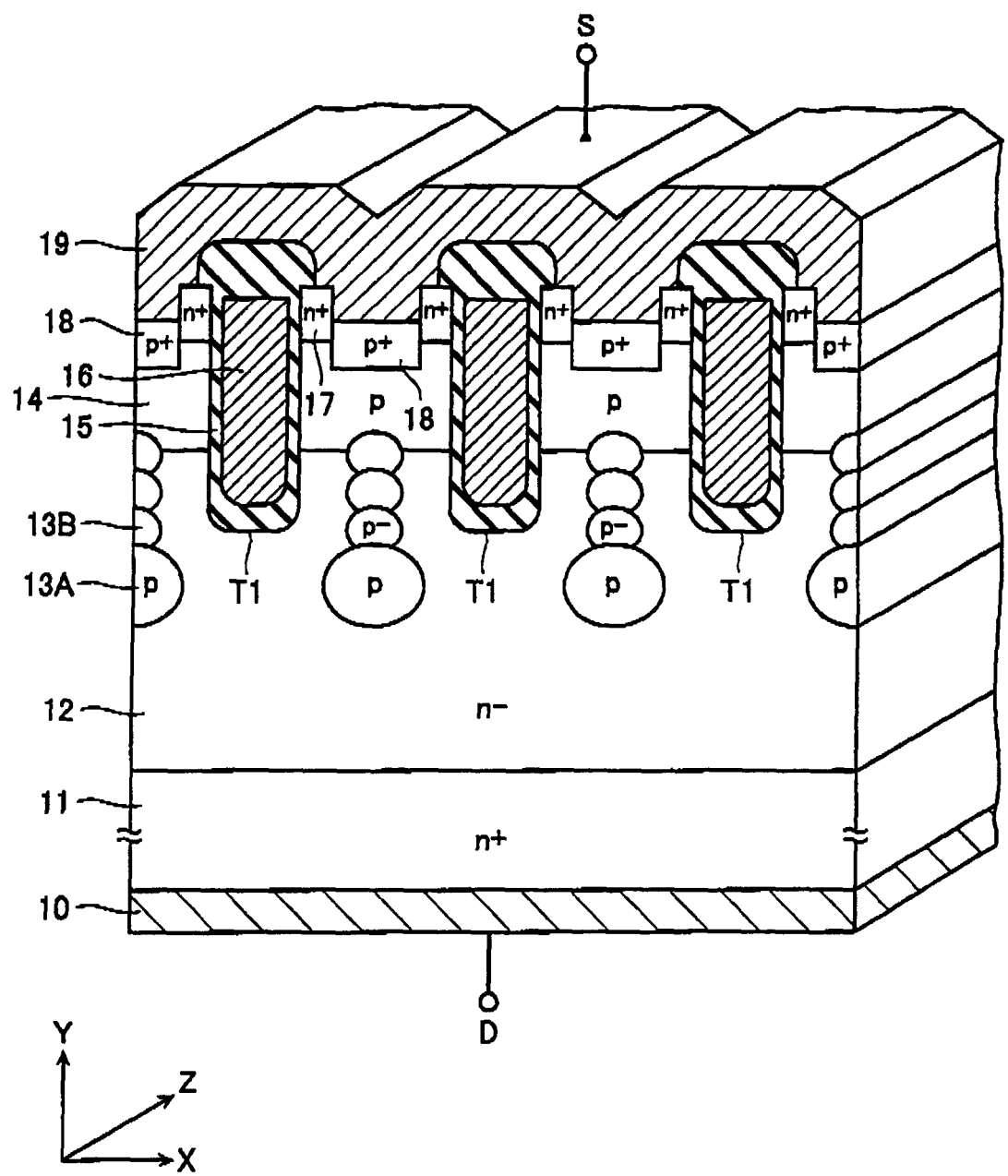
FIG. 7 is a sectional view showing a structure of a semiconductor device according to a third embodiment of the present invention.

Next, a semiconductor device according to a third embodiment of the present invention is explained with reference to FIG. 7. The same elements in FIG. 7 as those in the first embodiment are designated with the same reference numerals and their detailed description is omitted here. This embodiment, similar to the second embodiment, is different from the first embodiment in that the p− type connecting layers 13B are formed to have a stripe shape extending in parallel to the gate electrode 16 or the like, and are connected to the p type buried layer 13A in the whole part (not one part) of the horizontal cross-section (the XZ plane). In contrast, in the first embodiment, the p− type connecting layers 13B are connected to the p type buried layer 13A in one part of the horizontal cross-section (the XZ plane). This embodiment is different from the second embodiment in that the p− type connecting layer 13B has a wave-like profile. Also in this embodiment, the p type buried layer 13A and the p− type connecting layer 13B may be formed using the same mask by changing the acceleration voltage and the impurity dose amount of ion implantation. For example, the p− type connecting layer 13B may be formed to have the wave-like profile as shown in FIG. 6, by keeping the impurity dose amount constant and changing the acceleration voltage in three steps.

Fourth Embodiment

Figure 8:
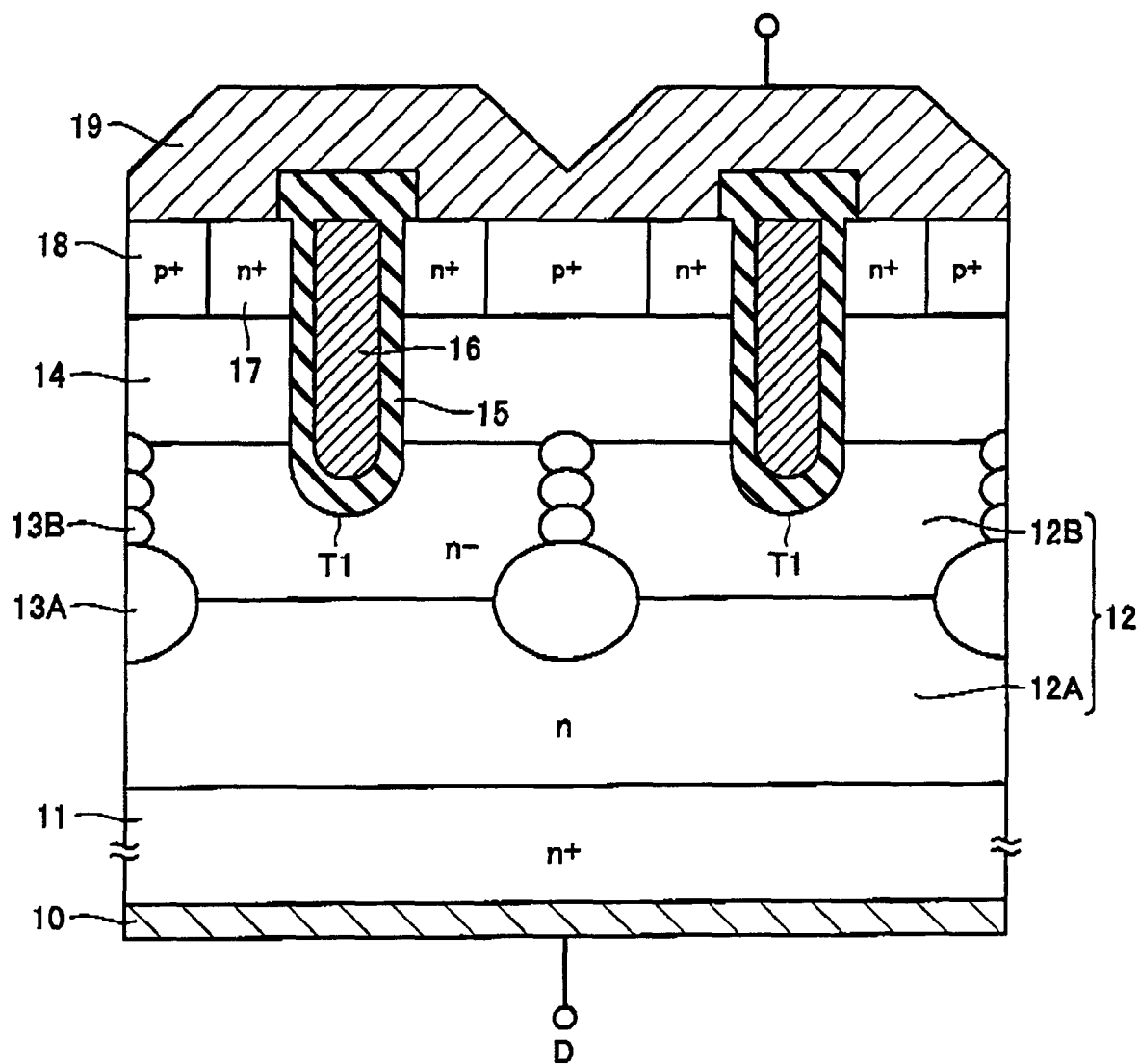
FIG. 8 is a sectional view showing a structure of a semiconductor device according to a fourth embodiment of the present invention.

Next, a semiconductor device according to a fourth embodiment of the present invention is explained with reference to FIG. 8. The same elements in FIG. 8 as those in the first embodiment are designated with the same reference numerals and their detailed description is omitted here. Note that the p− type connecting layer 13B may be connected to the p type buried layer 13A in a part of the Z direction, just like the first embodiment. Alternatively, it may be connected to the p type buried layer 13A in the whole part of the Z direction, just like the second or third embodiment.

This embodiment is different from the first embodiment in that the epitaxial layer 12 has two-layered structure. That is, the epitaxial layer 12 includes a first epitaxial layer 12A with a high impurity concentration, and a second epitaxial layer 12B whose impurity concentration is lower than this. For example, the first epitaxial layer 12A may have an impurity concentration of 2.0e16 cm-3, while the second epitaxial layer 12B may have an impurity concentration of 1.5e16 cm-3. In this case, the impurity concentration of the p type connecting layer 13B may be higher than that of the first embodiment in order to obtain a charge balance with regard to the first epitaxial layer 12B.

Thus, although the invention has been described with respect to particular embodiments thereof, it is not limited to those embodiments. It will be understood that various modifications and additions and the like may be made without departing from the spirit of the present invention.

What is claimed is:
1. A semiconductor device comprising:
a first semiconductor layer of a first conductivity type;
an epitaxial layer of a first conductivity type formed on a surface of the first semiconductor layer;
a base layer of a second conductivity type formed on a surface of the epitaxial layer;

a diffusion layer of a first conductivity type selectively formed in the base layer;

a trench penetrating the base layer to reach the epitaxial layer;

a gate electrode formed in the trench through a gate insulator film formed on an inner wall of the trench;

a first main electrode connected to a rear surface of the first semiconductor layer;

a second main electrode connected to the diffusion layer and the base layer;

a first buried diffusion layer of a second conductivity type formed in the epitaxial layer deeper than the bottom of the gate electrode; and a second buried diffusion layer connecting the first buried diffusion layer and the base layer and having a resistance higher than that of the first buried diffusion layer, the second buried diffusion layer being formed below the base layer and not in contact with the trench, the trench being formed to have a longitudinal direction along a first direction, while the first buried diffusion layer being formed to have a longitudinal direction along the first direction;

wherein the second buried diffusion layer has a smaller width than the first buried diffusion layer in a direction along a second direction orthogonal to the first direction.

2. The semiconductor device according to claim 1, wherein the second buried diffusion layer is connected to the first buried diffusion layer in part of a horizontal cross section.

3. The semiconductor device according to claim 2, wherein the first buried diffusion layer is formed to have a longitudinal direction along a first direction.

4. The semiconductor device according to claim 1, wherein the epitaxial layer includes a first epitaxial layer formed on the first semiconductor layer and having a first impurity concentration, and a second epitaxial layer formed on the first epitaxial layer and having a second impurity concentration lower than the first impurity concentration.

5. The semiconductor device according to claim 4, wherein the second buried diffusion layer is connected to the first buried diffusion layer in part of a horizontal cross section.

6. The semiconductor device according to claim 5, wherein the first buried diffusion layer is formed to have a longitudinal direction along a first direction.

7. The semiconductor device according to claim 4, wherein the second buried diffusion layer is connected to the first buried diffusion layer at the whole part of a horizontal cross section.

8. The semiconductor device according to claim 7, wherein the first buried diffusion layer is formed to have a longitudinal direction along a first direction.

9. The semiconductor device according to claim 1, wherein a depth Dg of the gate electrode, a depth Dd of the first buried diffusion layer from a bottom of the base layer, and an arrangement interval Ld of the first buried diffusion layer meet the relationship of $0.4 < Ld/(Dd-Dg) < 1.25$.

10. The semiconductor device according to claim 9, wherein the epitaxial layer includes a first epitaxial layer formed on the first semiconductor layer and having a first impurity concentration, and a second epitaxial layer formed on the first epitaxial layer and having a second impurity concentration lower than the first impurity concentration.

11. The semiconductor device according to claim 9, wherein the second buried diffusion layer is connected to the first buried diffusion layer in part of a horizontal cross section.

12. The semiconductor device according to claim 11, wherein the first buried diffusion layer is formed to have a longitudinal direction along a first direction.

13. The semiconductor device according to claim 9,
wherein the second buried diffusion layer has the same length as the first buried diffusion layer along the first direction, and is connected to the first buried diffusion layer at the whole part thereof along the first direction.

14. The semiconductor device according to claim 1, wherein the first buried diffusion layer is away from the first semiconductor layer.

15. The semiconductor device according to claim 1,
wherein the second buried diffusion layer has the same length as the first buried diffusion layer along the first direction, and is connected to the first buried diffusion layer at the whole part thereof along the first direction.

* * * * *